United States Patent [19]

Arai et al.

[11] 4,134,078

[45] Jan. 9, 1979

[54] GAIN CONTROL CIRCUIT

[75] Inventors: Takao Arai; Shigeru Okada, both of Yokohama; Kouichi Tomatsuri; Hiroshi Toeda, both of Katsuta, all of Japan

[73] Assignee: Hitachi, Ltd., Japan

[21] Appl. No.: 823,198

[22] Filed: Aug. 9, 1977

[30] Foreign Application Priority Data

Aug. 11, 1976 [JP] Japan .................................. 51-94883

[51] Int. Cl.$^2$ .............................................. H03G 3/30
[52] U.S. Cl. .................................. 330/254; 330/26 L; 330/285
[58] Field of Search ............... 330/254, 261, 278, 285, 330/69; 358/27

[56] References Cited

U.S. PATENT DOCUMENTS

| | | | |
|---|---|---|---|
| 3,641,450 | 2/1972 | Lunn | 330/254 |
| 3,970,948 | 7/1976 | Harwood et al. | 330/254 |

Primary Examiner—James B. Mullins
Attorney, Agent, or Firm—Craig & Antonelli

[57] ABSTRACT

A gain control circuit comprising a pair of transistors constituting a differential amplifier, and a pair of resistors each connected to the emitter of one of the transistors and having a sufficiently great resistance value compared with 1/gm of the transistor in the transistor operating range, the resistors being connected to a common regulated current supply to supply the halves of control current from the regulated current supply to the respective transistors, a pair of diodes are connected to the collectors of the respective transistors as a load, and a first variable resistor means is disposed in the current path traced from the diodes to the regulated current supply via the transistors and resistors for compensating fluctuation of the diffused resistance of the diodes. Further, a second variable resistor means is disposed in the base bias circuit for the transistors for compensating fluctuation of the base-emitter voltage of the transistors.

4 Claims, 5 Drawing Figures

GAIN CONTROL CIRCUIT

LIST OF PRIOR ART REFERENCE (37 CFR 1.56 (a))

The following reference is cited to show the state of the art:

"Electronic Design 13" published on June 21, 1974, pp. 94–99, entitled "Get gain control of 80 to 100 dB by using a two-quadrant multiplier.", written by Walter G. Jung, 1946 Pleasantville Rd., Forest Hill, Md. 21050.

BACKGROUND OF THE INVENTION

1. FIELD OF THE INVENTION

This invention relates to a gain control circuit for controlling the gain of an amplifier by a control signal.

2. DESCRIPTION OF THE PRIOR ART

A prior art gain control circuit for controlling the gain of an amplifier by a control signal has generally had a construction as shown in FIG. 1. Referring to FIG. 1, such a prior art gain control circuit comprises a pair of transistors 1 and 2 constituting a differential amplifier, a constant-current transistor 3, resistors 4, 5 and 6, a control signal source 7, and a differential amplifier 8. In this prior art gain control circuit, the output of the control signal source 7 is made variable to vary the current flowing through the emitter resistor 6 for the transistor 3 thereby controlling the gain. The reference numerals 9 and 10 designate base resistors for the transistors 1 and 2 respectively.

While applying the control signal from the control signal source 7 to the base of transistor 3, an input signal $E_i$ is applied to the base of transistor 1. Suppose that the gain of the differential amplifier 8 is unity, and its output is $E_o$, then there is the following relation between $E_i$ and $E_o$:

$$E_o/E_i = (q/kT) IR_{L1} \tag{1}$$

where q is the electric charge of each electron, k is the Boltzmann's constant, T is the absolute temperature, I is the current flowing through the emitter resistor 6 for the transistor 3, and $R_{L1}$ is the resistance value of the resistor 4. It will thus be seen that the gain can be controlled by the control signal since the gain varies in proportion to the current I flowing through the emitter resistor 6 for the transistor 3, and this current I is proportional to the output of the control signal source 7. The prior art having concern with such a gain control circuit is disclosed in, for example, "Electronic Design" No. 13, published June 21, 1974, pp. 94–99.

However, in such a gain control circuit, leakage of the control signal into the output $E_o$ of the differential amplifier 8 tending to extremely deteriorate the characteristic of the amplifier has generally been inevitable due to fluctuation of the resistance value of the resistors, and fluctuation of the base-emitter voltage and current amplification factor of the transistors.

SUMMARY OF THE INVENTION

It is a primary object of the present invention to provide a gain control circuit which minimizes the undesired leakage of the control signal into the amplifier output.

According to the present invention, a pair of resistors having a sufficiently great resistance value compared with 1/gm of the transistors in their operating range are respectively connected in series with the emitters of the transistor pair constituting the differential amplifier in the prior art construction so that the halves of the control current can be supplied to the respective transistors constituting the differential circuit from the regulated current supply consisting of the transistor, its emitter resistor and variable control current source. In the present invention, the load resistors in the prior art construction are replaced by diodes respectively so as to utilize the fact that the small signal resistance of diodes varies depending on the current flowing therethrough. The present invention further comprises a pair of adjusting or regulating means so that fluctuation of the diffused resistance of the diodes and fluctuation of the base-emitter voltage of the differentially operating transistor pair driving the diodes can be compensated independently of each other.

DETAILED DESCRIPTION OF THE PREFERRED EMBODIMENTS

Figure 1:
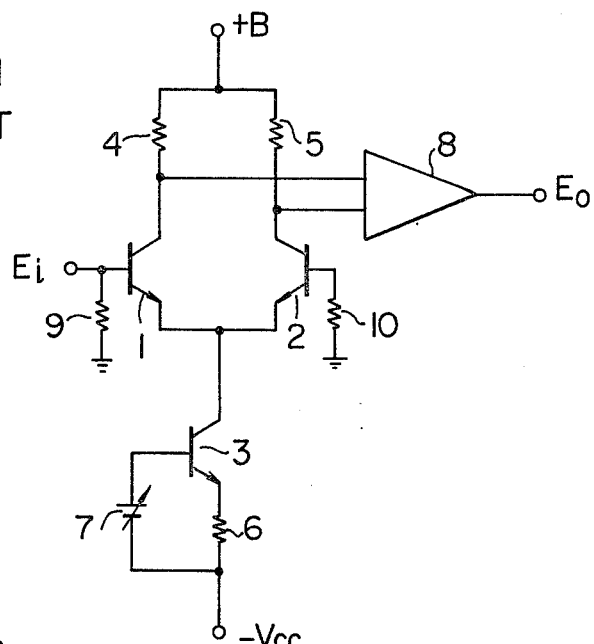
FIG. 1 is a circuit diagram of a prior art gain control circuit as discussed hereinbefore.
Figure 2:
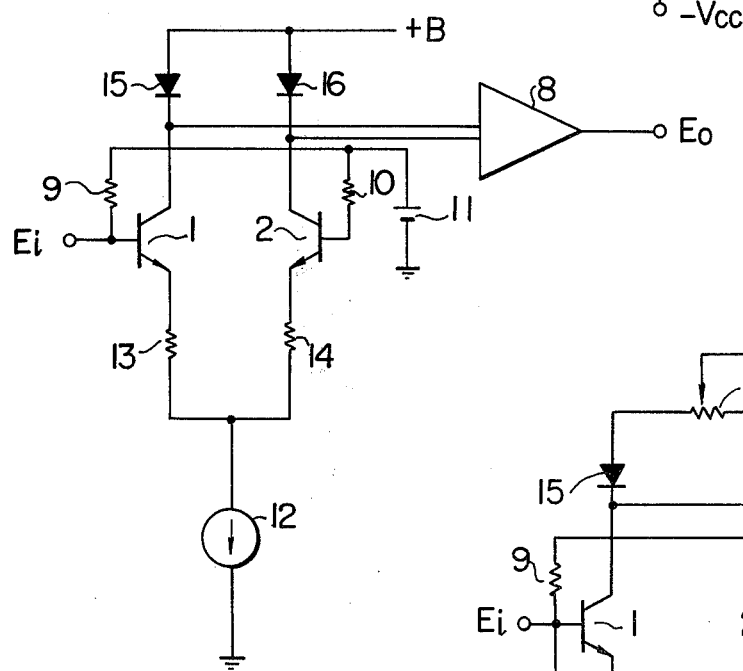
FIG. 2 is a circuit diagram of an improved gain control circuit proposed prior to the disclosure of the present invention.

For a better understanding of the present invention, a gain control circuit of FIG. 2, which is an improvement of the prior art circuit shown in FIG. 1, will be described before describing the present invention in detail. In the improved gain control circuit shown in FIG. 2, a pair of resistors 13 and 14 having a sufficiently great resistance value compared with 1/gm of the transistors 1 and 2 in their operating range are respectively connected in series with the emitters of transistors 1 and 2 constituting the differential amplifier. In FIG. 2, the regulated current supply consisting of the transistor 3, its emitter resistor 6 and variable control signal source 7 is generally designated by the reference numeral 12. These resistors 13 and 14 are provided so that the halves of the control current can be supplied from the regulated current supply 12 to the respective transistors 1 and 2 constituting the differential circuit. The load resistors 4 and 5 in FIG. 1 are replaced by diodes 15 and 16 respectively so as to utilize the fact that the small signal resistance of diodes varies depending on the current flowing therethrough. The reference numeral 11 designates a bias voltage source.

Suppose that $R_9$, $R_{10}$, $R_{13}$ and $R_{14}$ are the resistance values of the resistors 9, 10, 13 and 14 respectively; $r_{15}$ and $r_{16}$ are the small signal resistance values of the diodes 15 and 16 respectively; $V_1$ and $hfe_1$ are the base-emitter voltage and current amplification factor of the transistor 1 respectively; $V_2$ and $hfe_2$ are the base-emitter voltage and current amplification factor of the transistor 2 respectively; and $I_{12}$ and $i_{12}$ are the DC current and AC current of the regulated current supply 12 respectively. Then, the gain of the amplifier in FIG. 2 is generally given by $r_{15} + r_{16}/R_{13} + R_{14}$. The small signal resistance values $r_{15}$ and $r_{16}$ of the diodes 15 and 16, when they are ideal ones, are given by $r_{15} = kT/qI_{15}$ and $r_{16} = kT/qI_{16}$, where $I_{15}$ and $I_{16}$ are the DC currents flowing through the diodes 15 and 16 respectively. The relation $I_{15} + I_{16} = I_{12}$ holds in FIG. 2. Assume that $I_{15} = I_{16}$, then the gain of the amplifier in FIG. 2 is given by $4kT/qI_{12}(R_{13} + R_{14})$. Thus, the gain of the amplifier can be controlled by the current supplied from the regulated current supply 12. By the relative subtracting operation carried out in the differential amplifier 8 on the outputs of the transistors 1 and 2, the control current portions supplied from the regulated current supply 12 cancel each other ideally and do not appear in the output of the differential amplifier 8.

However, this improved gain control circuit shown in FIG. 2 is not still completely satisfactory in that fluctuation of the resistance value of the resistors 13 and 14, fluctuation of the base-emitter voltage and current amplification factor of the transistors 1 and 2, and fluctuation of the diffused resistance of the diodes 15 and 16 give rise to leakage v of the control signal given by the following approximate expression:

$$v \approx \frac{2kT}{q} \cdot \frac{i_{12}}{I_{12}} \cdot \frac{1}{I_{12}R_e} \Delta V_f + i_{12}r_d\left(\frac{\Delta r_d}{r_d} + \frac{\Delta R_e}{R_e}\right)$$

where $R_e = R_{13} + R_{14}/2$, $R_{13} = R_e + \Delta R_e$, $R_{14} = R_e - \Delta R_e$, $\Delta V_f = V_1 - V_2$, $r_d$ is the mean value of the diffused resistances of the diodes 15 and 16, and $\Delta r_d$ is the deviation of the diffused resistance values of the diodes 15 and 16 from the mean value $r_d$. Generally, a transistor having its base and collector short-circuited to each other has a diffused resistance lower than that of a diode. However, the diffused resistance of such a transistor is still in the order of several ohms, and it fluctuates over a range of several ohms too. Further, the base-emitter voltage of individual transistors fluctuates over a range of about 50 mV. Thus, in the case of the gain control circuit of FIG. 2 which may have a gain control range of about 20 dB, the ratio of the output signal to the leakage control signal will only be in the order of 20 dB to 40 dB when the non-linear distortion of the diodes is taken into account.

It is therefore the object of the present invention to provide a gain control circuit which is improved over the circuit shown in FIG. 2 in that the undesired leakage of the control signal in the amplifier output can be further reduced.

As pointed out above, the leakage of the control signal in the output of the proposed gain control circuit shown in FIG. 2 results principally from the fluctuation of the diffused resistance of the diodes and the fluctuation of the base-emitter voltage of the differentially operating transistors driving the diodes. In the present invention, the leakage of the control signal in the output is minimized by providing means which can easily remove the sources of fluctuations independently of each other.

Figure 3:
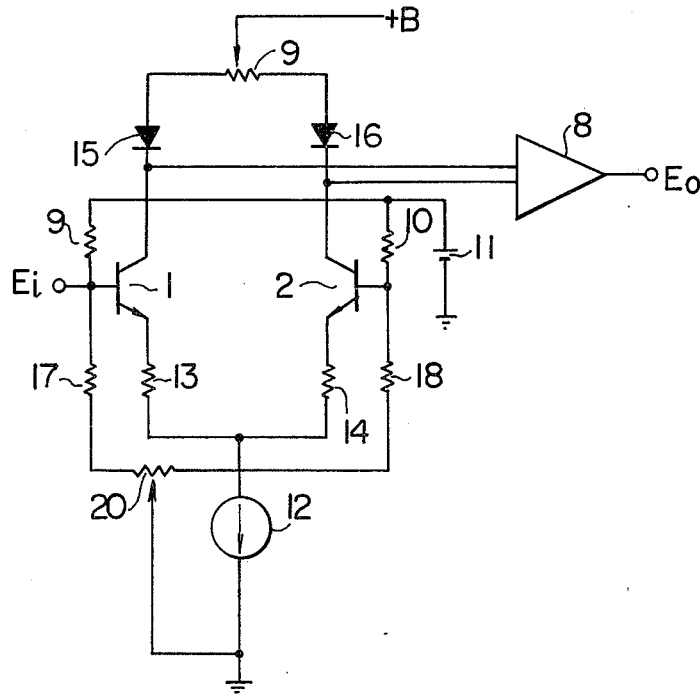
FIGS. 3, 4 and 5 are circuit diagrams of preferred embodiments of the gain control circuit according to the present invention.

FIG. 3 shows a first preferred embodiment of the gain control circuit according to the present invention. In FIG. 3, the same reference numerals are used to denote the same parts appearing in FIG. 2 since the circuit shown in FIG. 3 is an improvement in that shown in FIG. 2. The gain control circuit shown in FIG. 3 includes resistors 17, 18, and semi-fixed resistors 19, 20 in addition to the elements shown in FIG. 2.

Referring to FIG. 3, the semi-fixed resistor 19 is interposed between the power supply terminal +B and the diodes 15 and 16 in order to absorb or compensate the fluctuation of the diffused resistance of the diodes 15 and 16, thereby balancing the right-hand and left-hand loads of the differential circuit constituted by the transistors 1 and 2 and cancelling the leakage of the control signal in the differential amplifier 8 disposed in the next stage. The other semi-fixed resistor 20 regulates the base voltage of the transistors 1 and 2 to compensate the fluctuation of the base-emitter voltage of these transistors 1 and 2.

As described previously, the leakage v' of the control signal in this case is given by the following approximate expression:

$$v' = \frac{2kT}{q} \cdot \frac{i_{12}}{I_{12}} \cdot \frac{1}{I_{12}R_e} \Delta V_f + i_{12}r_d\left(\frac{\Delta r_d}{r_d} + \frac{\Delta R_e}{R_e}\right)$$

$$= i_{12}\left\{\frac{2kT}{q} \cdot \frac{\Delta V_f}{I_{12}^2 R_e} + r_d\left(\frac{\Delta r_d}{r_d} + \frac{\Delta R_e}{R_e}\right)\right\}$$

In the embodiment of the present invention shown in FIG. 3, the semi-fixed resistors 19 and 20 are especially provided for compensating $\Delta V_f$ and $\Delta r_d$ respectively so that the leakage of the control signal in the output can be minimized. Generally, it is essentially necessary to repeatedly regulate two or more parts of such a circuit when regulation of such parts is required for the purpose of improving one aspect of the performance of the circuit. In the case of the present invention, however, the semi-fixed resistor 20 is manipulated in a state in which the current $I_{12}$ of the regulated current supply 12 is maintained minimum in the desired gain control range, and the semi-fixed resistor 19 is then manipulated in a state in which the current $I_{12}$ is maintained maximum in the desired gain control range. Thus, repeated regulation is unnecessary.

Figure 4:
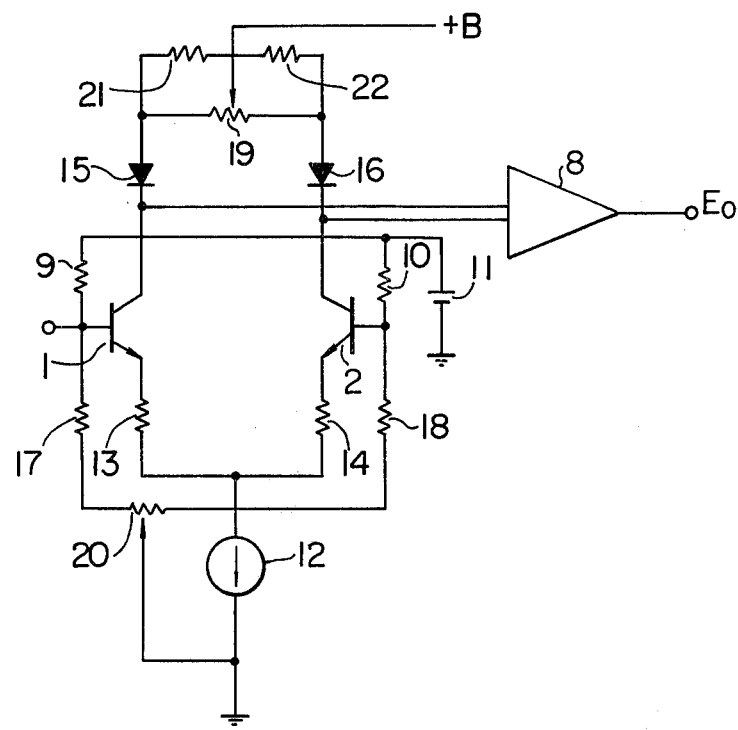

FIG. 4 shows a second preferred embodiment of the present invention which is a modification of the embodiment shown in FIG. 3. Referring to FIG. 4, a pair of resistors 21 and 22 are connected in parallel to the semi-fixed resistor 19 in FIG. 3 to limit the regulating or compensating range. It is apparent that the operation of the gain control circuit shown in FIG. 4 is the same as that shown in FIG. 3.

Figure 5:
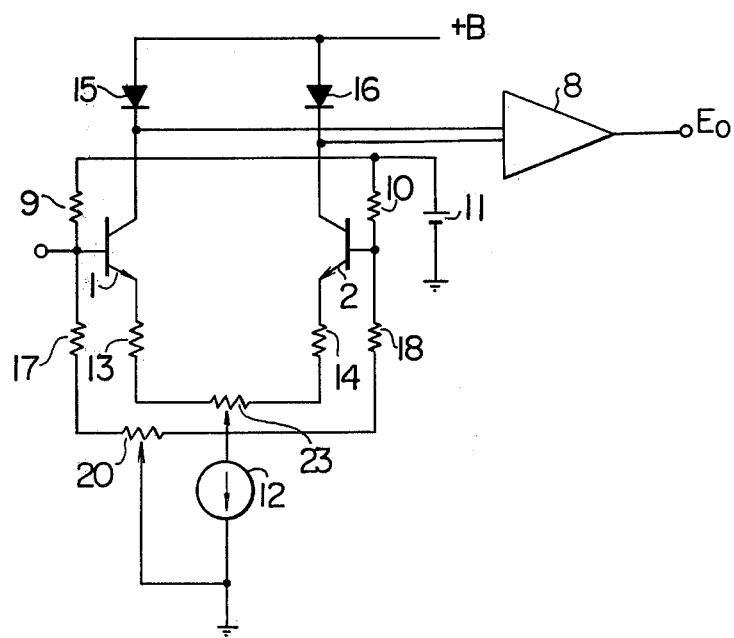

FIG. 5 shows a third preferred embodiment of the present invention which is another modification of the embodiment shown in FIG. 3 and operates in the same manner as that shown in FIG. 3. Referring to FIG. 5, the semi-fixed resistor 19 is eliminated, and a semi-fixed resistor 23 is interposed between the regulated current supply 12 and the resistors 13 and 14 so as to compensate $\Delta R_e$ in lieu of $\Delta r_d$.

The aforementioned embodiments of the present invention have been illustrated to include a pair of diodes as a load. However, a plurality of diodes may be employed to improve the distortion and S/N ratio, and each of such diodes may also be replaced by a transistor arranged to operate as a diode.

Prior art gain control circuits of this kind have been defective in that the performance thereof is easily adversely affected by fluctuations of the properties of component parts. While gain control circuits capable of operation with satisfactory performance have been realized by making part of the circuitry into, for example, an integrated circuit form, these gain control circuits have generally been too expensive to be economically put into practical use. In contrast, the present invention provides an inexpensive gain control circuit in which two regulating means are provided for regulating substantially independently of each other the two sources of fluctuations of the properties of the basic parts. The present invention exhibits such a remarkably great industrial merit that undesired leakage of the control signal into the output signal can be minimized in spite of the use of discrete parts.

We claim:

1. A gain control circuit comprising:
   a pair of transistors constituting a differential amplifier;
   a pair of resistors each connected at one end thereof to an emitter of one of said transistors said resistors having a large resistance value compared with 1/gm of the transistor in a transistor operating range;
   a regulated current supply connected at one terminal thereof to the other ends of said resistor pair for supplying a regulated control current to said transistor pair through said resistor pair;
   a pair of semiconductor elements each connected at one electrode thereof to a collector of one of said transistors and controlled in resistance with the regulated control current from said regulated current supply;
   a first variable resistor means connected between said semiconductor elements and a power supply for compensating for unbalanced components of DC resistance of said semiconductor elements; and
   a bias circuit connected to the bases of said transistors, said bias circuit including a second variable resistor means for compensating for unbalanced components of base-to-emitter voltages of said transistors.

2. A gain control circuit as claimed in claim 1, wherein a pair of resistors are additionally connected in parallel with said first variable resistor means.

3. A gain control circuit comprising:
   a pair of transistors constituting a differential amplifier;
   a pair of emitter-circuit resistors each connected at one end thereof to the emitter of one of said transistors and having a large resistance value compared with 1/gm of the transistor in the transistor operating range;
   a first variable resistor means connected to the other ends of said emitter-circuit resistors for correcting the emitter-circuit resistors of said transistors;
   a regulated current supply connected to said transistors through said first variable resistor means and said emitter-circuit resistor for driving and controlling said transistors with a regulated current therefrom;
   a pair of semiconductor elements connected between the respective collectors of said transistors and a power supply and controlled in resistance with the regulated current from said regulated power supply; and
   a bias circuit connected to the bases of said transistors, said bias circuit including a second variable resistor means for compensating for unbalanced components of base-to-emitter voltages of said transistors.

4. A gain control circuit comprising:
   a pair of transistors constituting a differential amplifier;
   a pair of emitter-circuit resistors each connected at one end thereof to the emitter of one of said transistors and having a large resistance value compared with 1/gm of the transistors in a transistor operating range;
   a regulated current supply connected to said transistor pair for driving and controlling said transistor pair with a regulated current;
   a pair of semiconductor elements connected between the respective collectors of said transistor pair and a power supply and controlled in resistance with said regulated current;
   a first variable resistor means disposed in a pair of current paths from said power supply to said regulated current supply for compensating for DC resistances of said pair of current paths; and
   a second variable resistor means disposed in a bias circuit connected to said transistor pair for correcting unbalanced components of base-to-emitter voltages of said transistors.

* * * * *